United States Patent [19]

Nakaso et al.

[11] Patent Number: 5,690,837

[45] Date of Patent: Nov. 25, 1997

[54] PROCESS FOR PRODUCING MULTILAYER PRINTED CIRCUIT BOARD

[75] Inventors: Akishi Nakaso, Oyama; Koichi Tsuyama; Kazuhisa Otsuka, both of Shimodate; Haruo Ogino, Tochigi-ken; Yoshihiro Tamura; Teiichi Inada, both of Shimodate; Kazunori Yamamoto, Tsukuba; Akinari Kida, Tochigi-ken; Atsushi Takahashi, Yuki; Yoshiyuki Tsuru, Shimodate; Shigeharu Arike, Tochigi-ken, all of Japan

[73] Assignee: Hitachi Chemical Company, Ltd., Tokyo, Japan

[21] Appl. No.: 576,488

[22] Filed: Dec. 21, 1995

[30] Foreign Application Priority Data

May 23, 1995 [JP] Japan .................................. 7-123575
May 23, 1995 [JP] Japan .................................. 7-123576

[51] Int. Cl.$^6$ .................................. B44C 1/22; C23F 1/00
[52] U.S. Cl. .................................. 216/17; 216/20; 216/36
[58] Field of Search .................................. 216/13, 17, 18, 216/20, 34, 35, 36, 41, 78, 84, 105; 427/97; 29/852

[56] References Cited

U.S. PATENT DOCUMENTS 4,734,156  3/1988  Iwasa .................................. 216/13
5,079,065  1/1992  Masakazu et al. .................................. 428/137
5,517,758  5/1996  Nakamura .................................. 216/36 X

FOREIGN PATENT DOCUMENTS 2 387 568  11/1978  France .

OTHER PUBLICATIONS

Patent Abstracts of Japan, vol. 14, No. 234 (E–0929), 17 May 1990.
Patent Abstracts of Japan, vol. 18, No. 22, (E–1490), 13 Jan. 1994.
Patent Abstracts of Japan, vol. 18, No. 661 (E–1644), 14 Dec. 1994.

*Primary Examiner*—William Powell
*Attorney, Agent, or Firm*—Antonelli, Terry, Stout & Kraus, LLP.

[57] ABSTRACT

In a process for producing a multilayer printed circuit board comprising drilling holes for via holes in a composite film material containing at least a copper foil and an insulating half-cured adhesive layer, laminating the resulting film material on an innerlayer circuit substrate, ad electrically connecting an innerlayer circuit with an outer layer copper foil, when an adhesive resin flowed into the holes is roughened, or when a composite film material having a copper foil of less than 12 μm thick formed on a carrier is used, or a special cushion material is further laminated on the laminate of the innerlayer circuit substrate and the film material, electrical connection reliability is enhanced and circuit density can be increased with easy steps.

13 Claims, 5 Drawing Sheets

FIG. 6C  DRILLING OF HOLES

FIG. 6D

FIG. 6E  MULTILAYER LAMINATION

FIG. 6F

FIG. 6G  REMOVAL OF CARRIER LAYER

FIG. 6H  PLATING AND FORMATION OF WIRING

PROCESS FOR PRODUCING MULTILAYER PRINTED CIRCUIT BOARD

BACKGROUND OF THE INVENTION

This invention relates to processes for producing multilayer printed circuit boards.

Higher densification of multilayer printed circuit boards is generally attained by an increase of circuit layers. But when the circuit layers are simply increased, the number of through-holes for connecting circuits of individual layers increases with an increase of areas of the through-holes, resulting in lowering in capacity for forming circuits. In order to avoid such a disadvantage, there is proposed a process for forming holes for connection on only the portions necessary for connection to provide "via holes".

For example, there is proposed a process for producing a multilayer printed circuit board comprising drilling holes for via holes in a single sided copper-clad laminate having a semi-cured insulating adhesive layer on an insulating layer side, or a copper foil having a semi-cured insulating adhesive layer on one side thereof, laminating the resulting hole-drilled sheet on an innerlayer circuit substrate under pressure with heating to give an integral laminate, and if necessary, drilling through-holes, and plating the holes for via holes and through-holes. This process has an advantage in that connecting holes for inner-layer circuits can easily be formed. But, at the time of lamination under pressure with heating, since the resin on inner walls of the holes melts first, followed by curing, the surface of it becomes smooth. Thus, even if electroless plated copper deposits, adhesive strength between the resin surface and the plated copper deposit is low. Thus, the plated copper deposit is peeled from the resin surface to generate spaces by heat treatment employed during the production of multilayer printed circuit board. Into these spaces, various treating solutions used during the production of multilayer printed circuit board are soaked, resulting in causing various problems in that corrosion of plating takes place, swelling or peeling of plating takes place by the heat of solder at the time of mounting electronic parts. Further, when the adhesive resin layer does not contain reinforcing fibers, the resin easily flows so as to fill the holes and to make the hole diameter too small when subjected to heating under pressure, resulting in causing a problem in that it becomes impossible to obtain an area necessary for connecting the innerlayer circuit electrically.

Figure 4:
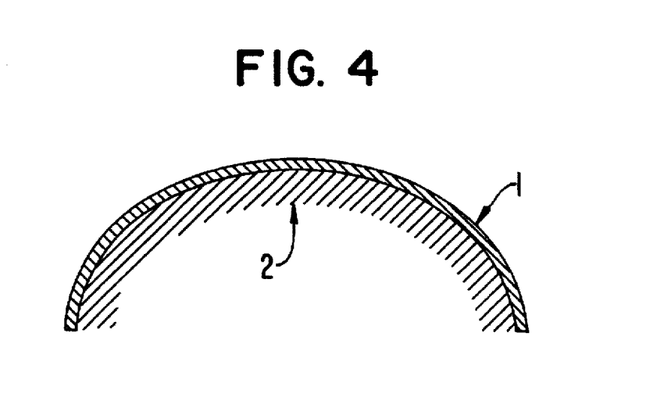
FIG. 4 is a cross-sectional view of a curled copper foil having a semi-cured adhesive layer on one side thereof.
Figure 5:
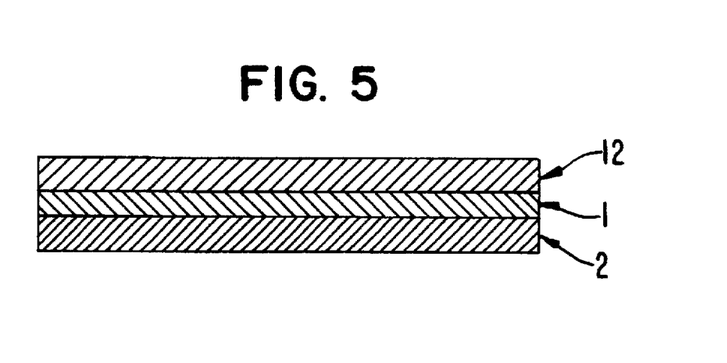
FIG. 5 is a cross-sectional view of one example of an ultra-thin copper foil formed on a carrier.

On the other hand, JP-A 2-62095 discloses a process for producing a multilayer printed circuit board comprising bonding a reinforcing material such as a metal foil for protection to one side of a copper foil and bonding an adhesive sheet to another side of the copper foil, drilling holes for via holes previously, laminating the resulting sheet on an inner-layer circuit substrate to give an integral laminate, metalizing inner walls of via holes, and conducting electrical connection. According to this process, it is necessary to form the adhesive sheet and to conduct the step of bonding the adhesive sheet to the copper foil, resulting in making this process complicated. Further, since the adhesive sheet is handled as a single body, it is necessary to impart flexibility to the adhesive layer by using a rubber component which is low in heat resistance. In addition, even if this process is improved by using a copper foil coated with an adhesive so as to reduce the number of steps, and not using the rubber component which is low in heat resistance, there takes place a problem of causing curling of the copper foil as shown in FIG. 4, wherein numeral 1 is a copper foil and numeral 2 denotes an adhesive layer with a semi-cured state, when the thickness of copper foil is 12 μm or less. The curled copper foil remarkably lowers working efficiency at the steps of drilling holes and multilayer lamination and adhesion. Further, when the curled copper foil is forcedly flattened, the thin copper foil is sometimes broken.

SUMMARY OF THE INVENTION

It is an object of the present invention to provide a process for producing a multilayer printed circuit board excellent in adhesiveness of plating to inner walls of holes and high in connection reliability.

It is another object of the present invention to provide a process for producing a multilayer printed circuit board having a higher circuit density and excellent in working efficiency.

It is a further object of the present invention to provide a process for producing a multilayer printed circuit board satisfying both interlaminar connection reliability and surface smoothness at the same time without using glass cloth.

The present invention provides a process for producing a multilayer printed circuit board, which comprises the steps of:

a. drilling holes on predetermined positions of a film material obtained from a single sided copper-clad laminate having an insulating adhesive layer with a cured state of A stage or B stage on an insulating layer surface, or a film material obtained by forming an insulating adhesive layer with a cured state of A stage or B stage on one side of a copper foil, b. laminating the hole-drilled film material on an innerlayer circuit substrate so as to contact the insulating adhesive layer with the innerlayer circuit substrate and pressing with heating to give an integral laminate, c. roughening surfaces of the insulating adhesive layer flowed into the holes at the time of lamination under pressure and heating, d. conducting electrical connection between a circuit on the innerlayer circuit substrate and the copper portion or foil of the film material by plating inner walls of the holes or filling the holes with an electroconductive paste, and e. forming a circuit by processing the copper foil of the film material.

The present invention also provides a process for producing a multilayer printed circuit board, which comprises the steps of:

a. drilling holes on predetermined positions of a film material made from a ultra-thin copper foil formed on a carrier and having an insulating adhesive layer with a cured state of A stage or B stage on the copper foil, b. laminating the hole-drilled film material on an innerlayer circuit substrate so as to contact the insulating adhesive layer with the innerlayer circuit substrate and pressing with heating to give an integral laminate, c. removing the carrier from the laminate, d. conducting electrical connection between a circuit on the innerlayer circuit substrate and the copper foil of the film material via the holes formed in the film material after removal of the carrier, and e. forming a circuit by processing the copper foil of the film material.

The present invention further provides a process for producing a multilayer printed circuit board using the ultra-thin copper foil formed on the carrier as mentioned above, wherein in the step b), a cushion material showing fluidity with heating is further laminated on the film material and the inner-layer circuit substrate to give an integral laminate.

DESCRIPTION OF THE PREFERRED EMBODIMENTS

A multilayer printed circuit board can be produced by the Process A, which comprises the steps of:

a. drilling holes on predetermined positions of a film material obtained from a single sided copper-clad laminate having an insulating adhesive layer with a cured state of A stage or B stage on an insulating layer surface, or a film material obtained by forming an insulating adhesive layer with a cured state of A stage or B stage on one side of a copper foil, b. laminating the hole-drilled film material on an inner-layer circuit substrate so as to contact the insulating adhesive layer with the innerlayer circuit substrate and pressing with heating to give an integral laminate, c. roughening surfaces of the insulating adhesive layer flowed into the holes at the time of lamination under pressure and heating, d. conducting electrical connection between a circuit on the innerlayer circuit substrate and the copper portion or foil of the film material by plating inner walls of the holes or filling the holes with an electroconductive paste, and e. forming a circuit by processing the copper foil of the film material.

The Process A is characterized by having the step c), wherein the adhesive resin flowed into holes is roughened so as to strengthen the adhesion of plating in the holes and to enhance connection reliability.

In the step c), roughening of the surface of insulating adhesive layer can be carried out using an aqueous solution containing a permanganate or chromic acid.

In order to enhance the roughening of the adhesive layer, it is possible to add an inorganic filler soluble in an acid, for example, calcium carbonate, calcium magnesium carbonate, calcium silicate, etc. It is also possible to add an inorganic filler soluble in an alkali, for example, various silicate glass powders.

The most suitable concentration of a roughening component, temperature of roughening treatment and roughening time can be determined from the results obtained by observing the thus treated surface using an optical microscope or an electron microscope.

When the surface of adhesive layer previously containing one or more soluble fillers therein is roughened by dissolving exposed fillers on the surface, it is possible to select an acidic or alkaline roughening solution depending on the kind of fillers included in the adhesive layer.

It is also possible to employ both the roughening method using an alkali aqueous solution of a permanganate or an aqueous solution containing chromic acid and sulfuric acid, and the method of dissolving a soluble filler.

In order to control the fluidity of the adhesive resin, it is possible to use an adhesive layer containing one or more inorganic fillers in the step a).

Examples of the inorganic filler which controls the fluidity of the adhesive resin are carbon black, talc, metal oxides such as titanium oxide, glass powders, calcium carbonate, magnesium calcium carbonate, calcium silicate, etc.

It is also possible to co-use the soluble fillers for roughening and the inorganic fillers mentioned above. For example, glass powders can be dissolved by hydrogen fluoride and sodium hydroxide, calcium carbonate and magnesium calcium carbonate can be dissolved by hydrochloric acid and sulfuric acid, and calcium silicate can be dissolved by hydrochloric acid. Therefore, when the inorganic fillers mentioned above are exposed on inner walls of holes, desirable toughening of the inner walls can be obtained by dissolving these inorganic fillers.

As the single sided copper-clad laminate, there can be used a copper foil bonded to an insulating material (i.e. insulating layer) on one side thereof, for example, a single sided copper foil-clad laminate using glass cloth-epoxy resin, a single sided copper foil-clad laminate using a flexible polyimide film, etc.

As the insulating material, there can be used organic materials obtained by impregnating a reinforcing fibers such as paper, nonwoven fabric, glass cloth, etc., with a resin; non-reinforced resin products; flexible films; composite materials obtained from these materials and ceramics.

As the resin, there can be used a phenol resin, an epoxy resin, a polyimide resin, a polyester resin, a fluorine-containing resin, etc.

It is possible to use these insulating materials dispersing a catalyst for electroless plating therein.

As the adhesive, there can be used an epoxy resin adhesive, an acrylic modified resin, a polyimide resin adhesive, etc.

Such an adhesive can be coated on one side of a copper foil or on an insulating layer side of a single sided copper foil-clad laminate by, for example, a roll coating method, a dip coating method, a curtain coating method, etc.

It is also possible to use such an adhesive in the form of a film and bonded to a copper foil by laminating.

Such an adhesive film are commercially available; for example, Epoxy Adhesive Film AS-3000 (a trade name, mfd. by Hitachi Chemical Co., Ltd.), and MCF-3000E (a trade name for a copper foil bonded to an epoxy adhesive, mfd. by Hitachi Chemical Co., Ltd.).

The adhesive layer bonded to the copper foil should be in semi-cured state, more in detail, in a cured state of A stage or B stage, preferably B stage.

Preferable semi-cured state means a state having no sticking property at 40° C. or lower, and providing adhesive strength of 0.8 kgf/cm or more after multilayer lamination.

Such a semi-cured state can be determined experimentally by selecting heating conditions, that is, temperature and time.

In the step a), a hole having a diameter A for evaluating flowing amount of the adhesive is previously drilled. Between the step c) and the step d), a diameter C of innerlayer circuit exposed to the adhesive flowed into the hole is measured. The necessary hole diameter B for drilling in the film material can be calculated from B=D+(A−C), wherein A is a hole diameter for evaluating the flowing amount, C is a hole diameter with a reduced size after the lamination and D is the minimum hole diameter necessary for connection. By this, holes which do not satisfy the minimum hole diameter necessary for connection can be selected. Further, such data can be taken into consideration for determining the selection of adhesive, the kind and amount of inorganic fillers, and laminating conditions.

The holes for via holes can be formed by punching, drilling, and the like conventional methods. The diameter of the holes is that conventionally used in the interlaminar connection of printed circuit boards, for example, 0.1 mm to 1.5 mm.

In the step b), wherein lamination under pressure with heating is conducted, the adhesive layer flows out into the holes to make the hole diameter (diameter C) for connecting to an innerlayer circuit substrate smaller. Thus, provided that the difference of (A−C) is equal to the flowing amount of the adhesive, and the hole diameter D necessary for connection is previously determined, the hole diameter for drilling in the film material can be determined by calculating D+(A−C).

For example, when the hole diameter A is 0.4 mm, the diameter C after lamination is 0.2 mm, the flowing amount of adhesive (A−C) is 0.2 mm. If the minimum diameter necessary for connection is 0.3 mm, the diameter for drilling can be 0.5 mm or more.

The minimum diameter for connection can be experimentally obtained, taking conditions necessary for the product, for example, connection resistance for thermal hysteresis, connection resistance at the temperature and time of solder bath necessitated, or conditions necessary for satisfying requirements from users at maximum.

As the electroconductive paste used in the step d), there can be used a silver paste, etc.

The steps a) to e) can be repeated depending on the number of multilayer required.

The multilayer printed circuit board can also be produced by Process B, which comprises the steps of:

a. drilling holes on predetermined positions of a film material made from a ultra-thin copper foil formed on a carrier and having an insulating adhesive layer with a cured state of A stage or B stage on the copper foil, b. laminating the hole-drilled film material on an innerlayer circuit substrate so as to contact the insulating adhesive layer with the innerlayer circuit substrate and pressing with heating to give an integral laminate, c. removing the carrier from the laminate, d. conducting electrical connection between a circuit on the innerlayer circuit substrate and the copper foil of the film material via the holes formed in the film material after removal of the carrier, and e. forming a circuit by processing the copper foil of the film material.

The film material used in the step a) can be prepared by coating an insulating adhesive material on one side of a copper foil and laminating a carrier (or reinforcing sheet material) such as a metal sheet or an organic material sheet on the other side of the copper foil, or coating an insulating adhesive material on a copper foil side of a copper foil formed on a carrier such as a metal sheet or organic material sheet.

As the carrier (or reinforcing sheet material), there can be used a metal foil or an organic material sheet having a large modulus of elasticity at high temperatures. Examples of the metal foil are metal foils made of copper, aluminum, etc., and metal foils coated with an adhesive. Further, it is also possible to use a copper foil on which one or more different metals are plated, for example, Peelable Electrolytic Copper foil (a trade name, mfd. by Furukawa Circuit Foil, Co., Ltd. a laminate of an aluminum foil of 70 μm thick and a copper foil of 5 μm thick), CCT Foil (a trade name, mfd. by Hitachi Chemical Co., Ltd., a composite metal foil containing a first copper layer which is to become a circuit and has a roughness suitable for adhesion to other resin, an intermediate layer of nickel-phosphorus alloy of 0.04 to 1.5 μm thick, and a second copper layer which has a sufficient strength as a metal layer as a whole, said composite metal foil being a metal foil or printed circuit board and disclosed in JP-A 5-206599). Further examples of copper foil are 40E5 (a trade name, mfd. by Mitsui Mining & Smelting Co., Ltd., having a 5 μm copper layer and an etchable aluminum layer), 40E9 (a trade name, mfd. by Mitsui Mining & Smelting Co., Ltd., having a 9 μm copper layer and a 70 μm copper layer as a carrier).

In any case, the thickness of copper foil is preferably less than 12 μm and 0.5 μm or more. The thickness of copper foil commercially available is 1 μm or more.

As the organic material sheet, there can be used those made from polyimide, polyethylene terephthalate, polypropylene, polyvinylidene chloride, polyvinylidene fluoride, polytetrafluoroethylene, polyvinyl alcohol, polyacrylonitrile, polyamide, cellophane, etc.

As the insulating adhesive, there can be used an epoxy resin adhesive, an acrylic modified resin adhesive, a polyimide adhesive, etc.

The insulating adhesive layer should have a cured state of A stage or B stage. In the Process B, the cured state is preferably that having no sticking property of 40° C. or lower, and providing adhesive strength of 0.6 kgf/cm or more after multilayer lamination.

Such an insulating adhesive material is commercially available, for example, under a trade name of AS-3000 (mfd. by Hitachi Chemical Co., Ltd.), MCF-3000 (mfd. by Hitachi Chemical Co., Ltd., a copper foil coated with an insulating adhesive).

The insulating adhesive layer can have a two or more layers having difference cured states in order to balance circuit filling properties and flowing amount of the adhesive. Such a structure having two or more layers can be obtained, for example, by coating a varnish to give a first coating layer on a copper foil, curing the coating to a cured state of B or C stage with heating, followed by coating of a second coating layer which is cured with heating under milder conditions than before to give a cured state of A or B stage.

Alternatively, it is possible to use as the first coating layer a flexible substrate or a layer having less fluidity such as a rubber with a high molecular weight, a phenoxy resin, an epoxy resin with a high molecular weight, a resin having as a main component a high molecular weight epoxy resin, etc., and to coat the second coating layer on the first coating layer, followed by curing with heating to the A or B stage.

In the present invention, the term A, B and C stage means a degree of curing of the insulating adhesive material conventionally used in this art. The A stage means a stage of almost uncured, not gelled, and finished heat release of 0 to 20% of the total heat release value for curing. The B stage means a stage of slightly cured and gelled slightly, and finished heat release of 20 to 60% of the total heat release value for curing. The C stage means a stage of considerably cured and gelled, and finished heat release of 60 to 100% of the total heat release value for curing.

The insulating adhesive layer can be formed by coating a varnish of adhesive on a copper foil or a film, using a bar coater, a roll coater, etc., which can provide an almost uniform thickness of coating with scarcely producing craters and voids.

When electronic parts having a large heat release amount are mounted, the insulating adhesive layer may contain one or more inorganic fillers such as alumina, silica, aluminum nitride, etc., in an amount of preferably 50% by volume or less. With an increase of adding amount of the inorganic filler, the heat release property increases but fluidity of the adhesive sheet is lowered at the same time, resulting in lowering the adhesiveness between the copper foil and the adhesive sheet. When the adding amount is more than 50% by volume, it becomes impossible to obtain sufficient solder heat resistant reliability.

The drilling holes can be carried out by piling 1 to 40 sheets of the film materials and drilling or punching holes at a time. The larger the number of piles becomes, the more improved in working efficiently. But when more than 40 sheets of film materials are piled, there is a tendency to cause problems in scattering in the hole diameter and generation of fin.

In the step b), the lamination under pressure with heating can be carried out by a conventional method. Pressing, vacuum pressing can be employed.

By using the carrier (or reinforcing sheet material), the workability in the step of indexing at the time of lamination can be improved. Particularly, when a thin copper foil is used, good workability can be maintained without causing curling of the copper foil bonded to an insulating adhesive material. The thickness of the carrier is preferably about 10 µm to 200 µm.

In the step c), the carrier can be removed by peeling or using a conventional chemical etching solution, e.g. containing KMnO₄ 20–90 g/liter and NaOH or KOH 20 g/liter or more.

In the step d), the interlaminar connection can be carried out by using a conductive paste, plating, soldering, wire bonding, and the like method.

The steps a) to e) of Process B can be repeated depending on the number of multilayer required.

In the above-mentioned Process B, when a cushion material showing fluidity with heating is further laminated on the film material and the innerlayer circuit substrate in the step b), the connection reliability can be enhanced by controlling the amount of adhesive flowed out into holes for via holes. This Process C is particularly effective in the production of multilayer printed circuit board without using glass cloth.

As the cushion material, there can be used paper, rubber sheet, silicone rubber sheet, various film materials, for example, made from polypropylene, polyethylene, polyvinylidene chloride, various fluorine-containing materials such as polytetrafluoroethylene, etc. It is also possible to use a combination of materials selected from paper, rubber and various thermoplastic films.

The thickness of cushion material can be determined from various conditions such as the thickness of insulating adhesive material, lamination temperature, lamination pressure, and the like.

The insulating adhesive layer should have a cured state of A stage or B stage. As to the fluidity of the adhesive resin, it is preferable to use an adhesive material having a flowing amount converted to an area changing rate of 0.2 to 5.0% when measured under the conditions of from the coated state to cured at 170° C./15 MPa/10 minutes. When the flowing amount (or area changing rate) is less than 0.2%, the filling of spaces among conductors in the innerlayer circuits becomes insufficient. On the other hand, when the flowing amount (or area changing rate) is more than 5.0%, the effect of controlling the ooze of the resin by the cushion material is insufficient, resulting in undesirably causing lowering in interlaminar connection reliability due to the large oozing amount of the resin. Further, when the fluidity is too large, the reduction in thickness among layers becomes large, resulting in undesirably lowering the insulating reliability.

The thickness of the carrier (or reinforcing sheet material) is preferably in the range of about 10 µm to 200 µm. When the thickness is too thin, concretely less than 10 µm, the effect for surface smoothness becomes undesirably small. On the other hand, when the thickness is too large, e.g. more than 200 µm, the fluidity of the cushion material is prevented, resulting in making the oozing amount of the resin larger due to non-control of oozing of the resin. When the hole diameter is 200 µm, the thickness of the carrier of about 50 µm is preferable.

According to the Process C, since the cushion material flows into the holes so as prevent the flowing of the carrier to the drilled holes for connection, the oozing amount of the insulating adhesive material can be reduced. Thus, it becomes possible to make the hole diameter for interlaminar connection smaller. Further, since the flowing of the cushion material into non-hole drilled portion of the carrier is small, the unevenness of the innerlayer copper foil can be flattened by the insulating adhesive material so as to improve the surface smoothness.

In the Process C, the insulating adhesive material and carrier can be drilled at the same time, so that the misregistration is rare and the cost for drilling becomes smaller compared with the process of lamination after individually drilling holes.

In the Process C, it is also possible to repeat the steps a) to e) depending on the number of multilayer required.

The present invention is illustrated by way of the following Examples.

Example 1

Figure 1A:
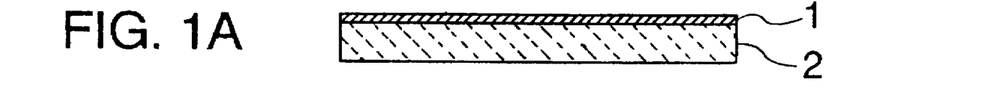
FIGS. 1A to 1F are cross-sectional views for explaining the steps of one embodiment of the present invention having the step of roughening an adhesive flowed into holes.

A copper foil having an insulating adhesive layer on one side as shown in FIG. 1A (commercially available under a trade name of MCF-3000E mfd. by Hitachi Chemical Co., Ltd.) was prepared by forming an adhesive layer 2 of 50 µm thick containing a high molecular weight epoxy polymer on a copper foil 1 of 18 µm thick.

The flowing amount (A–C) of the adhesive of the adhesive layer-added copper foil was 0.1 mm.

Figure 1B:
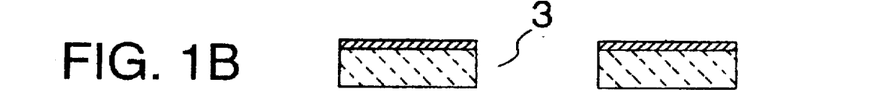

Then, holes for via holes having a diameter of 0.3 mm were drilled as shown in FIG. 1B. The minimum hole diameter necessary for connection was 0.15 mm.

Figure 1C:
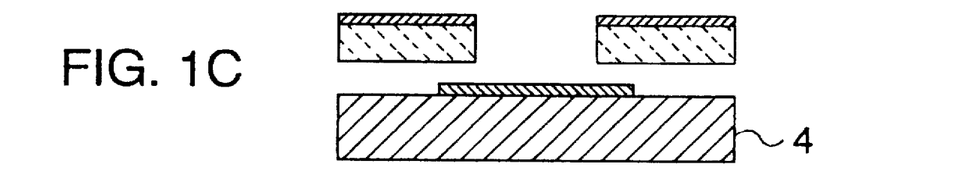

As shown in FIG. 1C, the hole-drilled copper-clad laminate was laminated on an innerlayer circuit substrate 4 to form an innerlayer circuit.

Figure 1D:
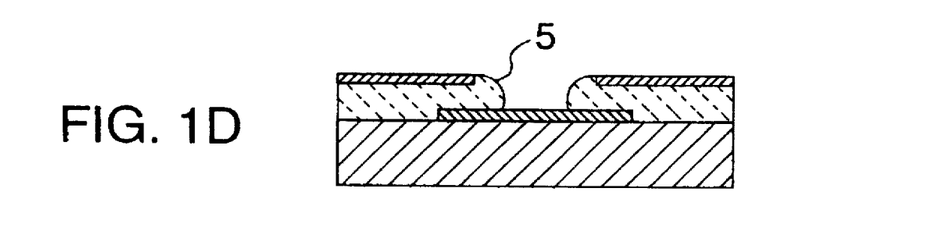

Then, the innerlayer circuit substrate and the hole-drilled copper foil changing an adhesive layer were pressed with heating to give an integral laminate. As shown in FIG. 1D, the adhesive layer flowed into the hole.

Figure 1E:
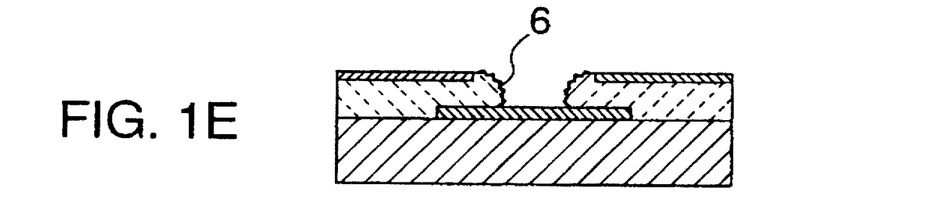

The surface of flowed adhesive layer 5 was roughen by dipping in the following roughening solution at 70° C. for 3 minutes as shown in FIG. 1E. In FIG. 1E, numeral 6 denotes a roughened portion.

| (Composition of roughening solution) | |
| --- | --- |
| Sodium permanganate | 70 g/liter |
| NaOH | 40 g/liter |

Figure 1F:
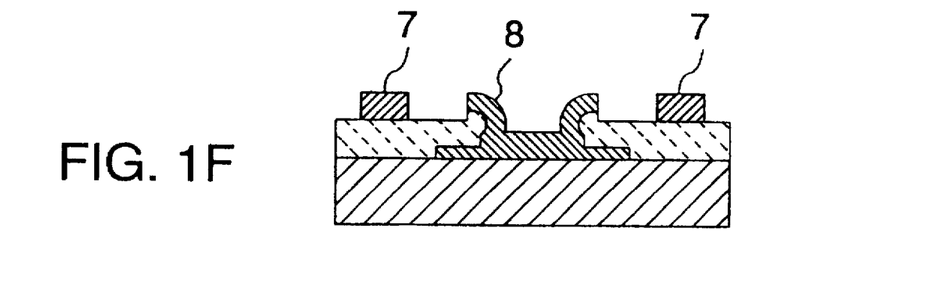

After conducting electroless plating for undercoating as usual, electric copper plating was conducted to the thickness of 25 μm to finally form circuit as shown in FIG. 1F by a conventional subtractive process. In FIG. 1F, numeral 7 denotes an outer layer wiring and numeral 8 denotes plating in the hole portion.

The resulting multilayer printed circuit board showed no peeling or blisters of plating in the hole portions even if immersed in a solder bath heated at 260° C. for 1 minute.

Example 2

Figure 2A:
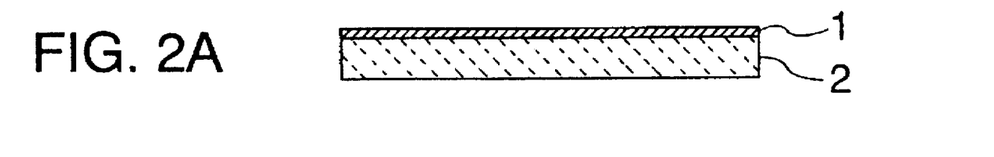
FIGS. 2A to 2F are cross-sectional views for explaining the steps of another embodiment of the present invention having the step of roughening an adhesive flowed into holes.

A copper foil having an insulating adhesive layer on one side as shown in FIG. 2A was prepared by forming an adhesive layer 2 of 50 μm thick containing a high molecular weight epoxy polymer on a copper foil 1 of 18 μm thick (commercially available under a trade name of MCF-3000E mfd. by Hitachi Chemical Co., Ltd.).

The flowing amount (A–C) of the adhesive of the adhesive layer-added copper foil was 0.3 mm.

Figure 2B:
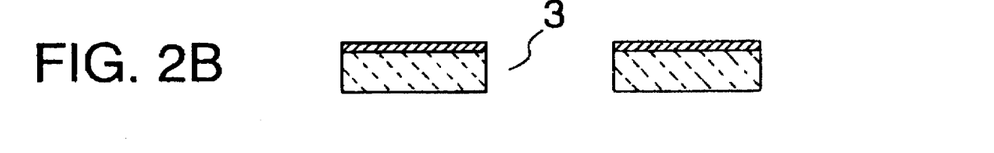

Then, holes 3 for via holes having a diameter of 1.0 mm were drilled using a punch machine as shown in FIG. 2B. The minimum hole diameter necessary for connection was 0.5 mm.

Figure 2C:
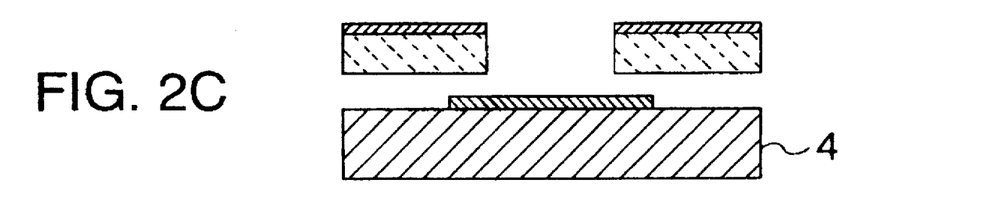

As shown in FIG. 2C, the hole-drilled copper-clad laminate was laminated on an innerlayer circuit substrate 4 to form an innerlayer circuit.

Figure 2D:
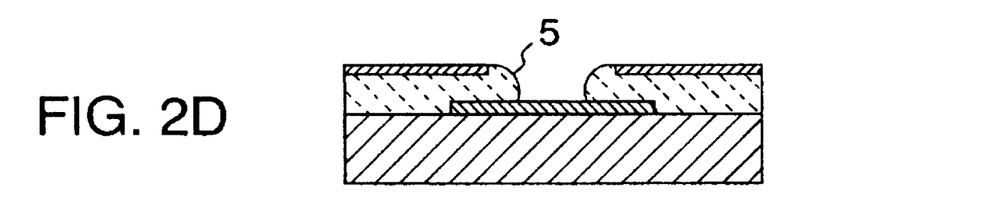

Then, the innerlayer circuit substrate and the hole-drilled copper foil having an adhesive layer were pressed with heating to give an integral laminate. As shown in FIG. 2D, the adhesive layer flowed into the hole. The flowed portion was roughened in the same manner as described in Example 1.

Figure 2E:
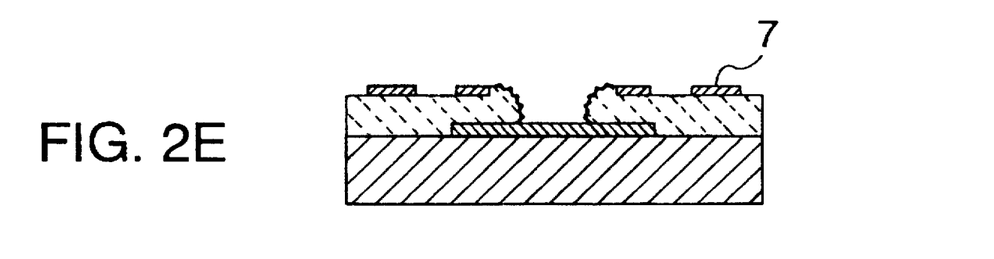

Unnecessary portions of outer copper foil were removed by etching to form surface wiring 7 (FIG. 2E).

Figure 2F:
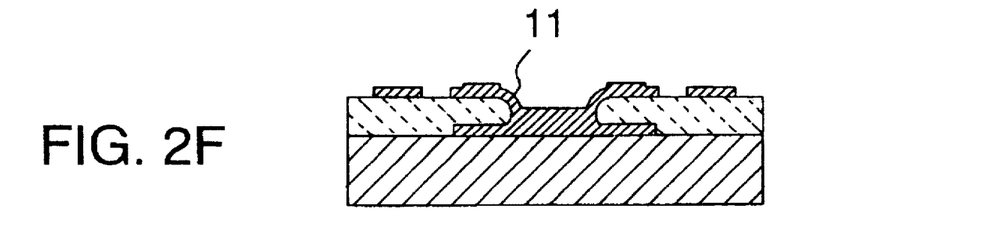

Then, the hole portions and land portions around the holes were selectively printed with a silver paste 11 to conduct electrical connection between the innerlayer wiring and the outer layer wiring (FIG. 2F).

When the resulting multilayer printed circuit board was subjected to a thermal shock test wherein the sample was dipped in an oil heated at 260° C. for 5 seconds and then dipped in water of normal temperature for 5 seconds as one cycle, and repeating 20 cycles, the raising rates of connection resistance of the outer layer wiring and the innerlayer wiring were within 10%, and the connection reliability at the hole portions was sufficient.

Figure 3:
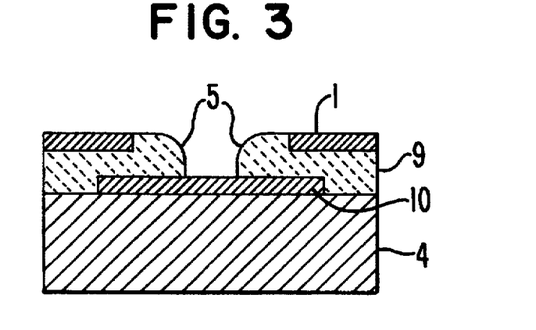
FIG. 3 is a cross-sectional view explaining the state wherein an adhesive resin is flowed into a hole at the time of lamination under pressure with heating.

FIG. 3 is a cross-sectional view explaining the stage wherein an adhesive resin is flowed into a hole at the time of lamination under pressure with heating. In FIG. 3, numeral 9 denotes a cured insulating adhesive layer, numeral 10 denotes an innerlayer wiring, and numerals 1, 4 and 5 are as defined above.

As mentioned above, the Process A can produce multilayer printed circuit boards sufficient in electrical connection between layers.

Example 3

Figure 6A:
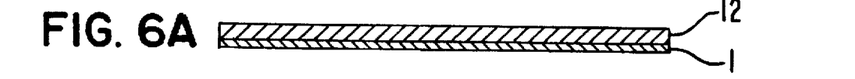
FIGS. 6A to 6H are cross-sectional views explaining the steps of one embodiment of the present invention wherein an ultra-thin copper foil formed on a carrier is used.
Figure 6B:
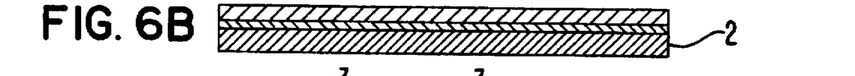

An adhesive 2 containing an epoxy resin having a high molecular weight of 100,000 or more was coated on the copper foil surface of Peelable Electrolytic Copper Foil (a trade name, mfd. by Furukawa Circuit Foil Co., Ltd. having an ultra-thin copper foil 1 of 5 μm thick on a carrier of aluminum sheet 12, shown in FIG. 6A) as shown in FIG. 6B so as to give an adhesive layer of 50 μm thick and semi-cured (B-stage). No curling took place at this time.

Figure 6C:
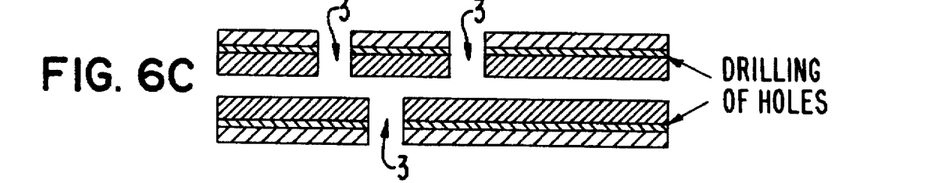

As shown in FIG. 6C, holes 3 for via holes having a diameter of 0.3 mm were drilled.

Figure 6D:
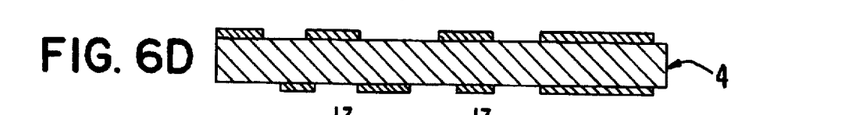

As shown in FIG. 6D, a copper-clad laminate of 0.3 mm thick as an inner circuit substrate 4 was prepared and subjected to formation of innerlayer wiring by a conventional etched foil process.

Figure 6E:
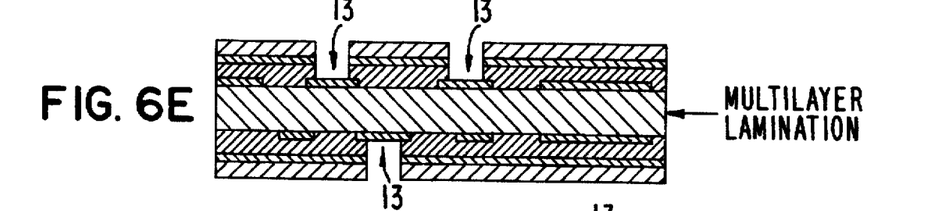

As shown in FIG. 6E, a pair of the hole-drilled copper foil having an adhesive layer thereon and the innerlayer circuit substrate were laminated and pressed under a pressure of 25 kgf/cm² with heating at 170° C. for 60 minutes to give an integral laminate. In FIG. 6E, numeral 13 denotes a via hole.

Figure 6F:
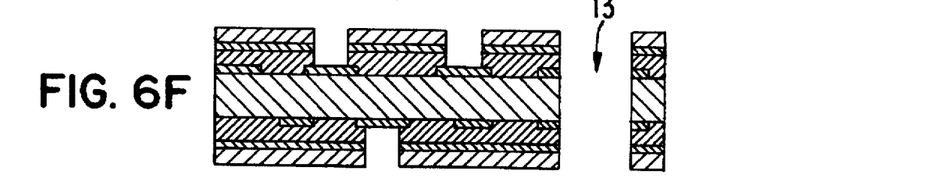
Figure 6G:
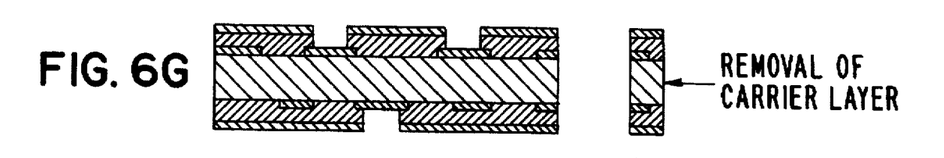
Figure 6H:
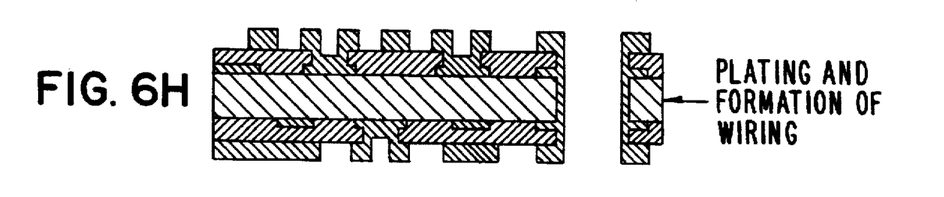
Figure 7:
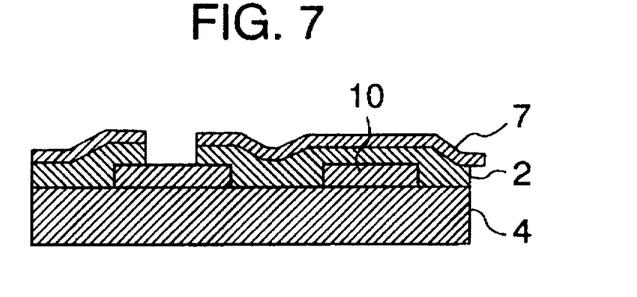
FIG. 7 is a cross-sectional view of a laminate obtained by not using a cushion material.
Figure 8:
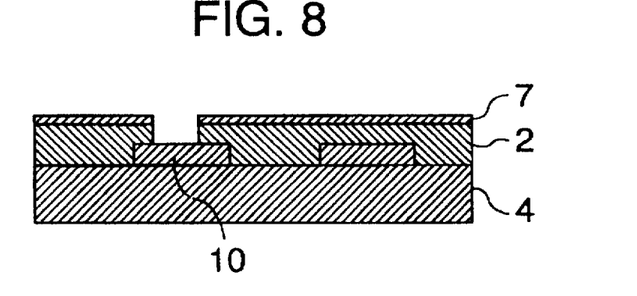
FIG. 8 is a cross-sectional view of a laminate obtained by using a cushion material.
Figure 9:
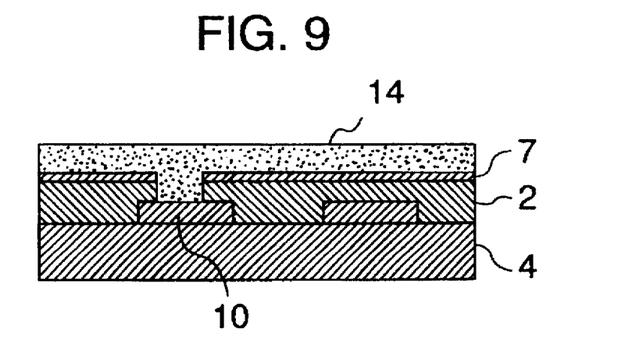
FIG. 9 is a cross-sectional view of a laminate when a cushion material is used.

As shown in FIG. 6F, a through hole 3 was drilled, and the aluminum sheet as a carrier was mechanically peeled as shown in FIG. 6G, followed by smear-removing treatment using a solution containing a permanganate and an alkali, plating to deposit a plating metal of 20 μm thick, forming an etching resist, and removal of unnecessary copper by etching to give a circuit board having a conductor with line/space of 60 μm.

Comparative Example 1

The process of Example 3 was repeated except for using a copper foil of 12 μm thick in place of Peelable Electrolytic Copper foil. But, the copper foil having the adhesive layer was curled to fail to conduct drilling holes and lamination.

Comparative Example 2

The process of Example 3 was repeated except for using a copper foil of 18 μm thick in place of the copper foil used in Comparative Example 1. No curling took place, but it was impossible to obtain a high density wiring of line/space of 60 μm/60 μm.

As mentioned above, according to the Process B, the multilayer printed circuit boards having a high wiring density can be produced with higher working efficiency.

Example 4

A multilayer printed circuit board was produced by the following steps (1) to (8).

(1) On a copper foil of 18 μm, an epoxy resin adhesive was coated so as to give a film thickness of 70 μm after dried, followed by drying at 130° C. for 10 minutes to give an copper foil having an insulating adhesive layer thereon. The flowing amount of the resin of adhesive material was 0.3%.

(2) The copper foil having the insulating adhesive layer was further laminated with a sticking sheet made from polyethylenetetraphthalate as a carrier (film thickness 70 μm).

(3) The resulting laminate was drilled to form holes for interlaminar connection having a hole diameter of 0.2 mm.

(4) As a cushion material, a polyethylene film of 150 μm thick was laminated on the copper foil side of the adhesive material-attached copper foil, which was laminated on an innerlayer circuit substrate having a copper foil circuit thickness of 18 μm, and subjected to pressing at 30 kgf/cm² and 170° C. for 1 hour to give an integral laminate.

(5) The polyethyleneterephthalate sticking sheet used as a carrier was peeled off.

(6) The copper foil surface was subjected to polishing, washing and plating pre-treatment.
(7) Interlaminar connection between the upper and lower circuits was conducted by copper plating.
(8) Unnecessary portions of surface copper foil were removed by etching to form the desired circuit.

Example 5

The process of Example 4 was repeated except for using a composite copper foil obtained by coating on a copper foil of 18 μm thick as a first coating layer an epoxy resin adhesive in 70 μm thickness after dried at 150° C. for 10 minutes, and as a second coating layer an epoxy resin adhesive so as to make the total thickness of the first and second coating layers 140 μm after dried at 130° C. for 10 minutes.

The flowing amount of the resin in the second coating layer was 0.3%.

Example 6

A multilayer printed circuit board was produced by the following steps (1) to (6).
(1) On a Peelable Electrolytic Copper Foil (a trade name, mfd. by Furukawa Circuit Foil Co., Ltd.) having a thickness of 79 μm (a first layer 70 μm, a second layer of copper 9 μm), an epoxy resin adhesive was coated so as to make the thickness 70 μm after dried at 130° C. for 10 minutes to give a copper foil having an insulating adhesive material. The flowing amount of the resin of adhesive material was 0.3%.
(2) The copper foil having the insulating adhesive layer was drilled to form holes for interlaminar connection having a hole diameter of 0.2 mm.
(3) As a cushion material, a polyethylene film of 150 μm thick was laminated on the copper foil side of the adhesive material-attached copper foil, which was laminated on an innerlayer circuit substrate having a copper foil circuit thickness of 18 μm, and subjected to pressing at 30 kgf/cm² at 170° C. for 1 hour to give an integral laminate.
(4) The first copper layer was peeled off.
(5) Interlaminar connection between the copper and lower circuits was conducted by copper plating.
(6) Unnecessary portions of surface copper foil were removed by etching to form the desired circuit.

Example 7

A multilayer printed circuit board was produced by the following steps (1) to (6).
(1) A copper foil having an insulating adhesive layer was prepared by using a composite metal foil CCT Foil (a trade name, mfd. by Hitachi Chemical Co., Ltd. having a first copper layer of 5 μm thick to be formed into a circuit having a surface roughness suitable for adhering to a resin, an intermediate layer of Ni-P alloy of 0.4 μm thick and a second copper layer of 20 μm thick) and coating an epoxy resin adhesive on the CCT Foil so as to make the film thickness 70 μm after dried at 130° C. for 10 minutes. The flowing amount of the resin of adhesive material was 0.3%.
(2) The copper foil having the insulating adhesive layer was drilled to form holes for interlaminar connection having a hole diameter of 0.2 mm.
(3) As a cushion material, a polyethylene film of 150 μm thick was laminated on the copper foil side of the adhesive material-attached copper foil, which was laminated on an innerlayer circuit substrate having a copper foil circuit thickness of 18 μm, and subjected to pressing at 30 kgf/cm² at 170° C. for 1 hour to give an integral laminate.
(4) The second copper layer was removed by etching.
(5) Interlaminar connection between the upper and lower circuits was conducted by copper plating.

Reference Example 1

The process of Example 4 was repeated except for not using the carrier.

Reference Example 2

The process of Example 6 was repeated except for not using the cushion material.

Reference Example 3

The process of Example 4 was repeated except for not using the carrier and the cushion material.

Comparative Example 3

The process of Example 6 was repeated except for using the adhesive sheet having the flowing amount of the resin of 0.1%.

Comparative Example 4

The process of Example 6 was repeated except for using the adhesive sheet having the flowing amount of the resin of 7%.

The multilayer printed circuit boards produced above were subjected to the following tests.

[Surface unevenness]

The surface unevenness was measured by using a surface roughness meter and the level difference between the highest portion and the lowest portion was defined as the surface unevenness (μm).

[Dozing amount]

An adhesive sheet having a hole of 0.2 mm in diameter was laminated on a circuit substrate and the distance of oozed or flowed adhesive material into the hole after lamination at 170° C. under 30 Kgf/cm² for 1 hour was measured (μm).

[Generation of voids]

No generation of voids having a diameter of 10 μm or more between the lower copper foil and the insulating adhesive material observed by a microscope was evaluated as "good".

When voids having a diameter of 10 μm or more were generated, it was evaluated as "no good".

The results of the tests are shown in Table 1.

TABLE 1

| Example No. | Surface unevenness (μm) | Oozing amount (μm) | Generation of voids |
|---|---|---|---|
| Example 4 | 9 | 44 | Good |
| Example 5 | 7 | 32 | Good |
| Example 6 | 9 | 30 | Good |
| Example 7 | 10 | 30 | Good |
| Reference | | | |

TABLE 1-continued

| Example No. | Surface unevenness (μm) | Oozing amount (μm) | Generation of voids |
|---|---|---|---|
| Example 1 | 18 | 45 | Good |
| Example 2 | 8 | 80 | No good |
| Example 3 Comparative | 8 | 80 | No good |
| Example 3 | 17 | 30 | No good |
| Example 4 | 8 | 100 | No good |

According to the Process C, unevenness of the innerlayer copper foil can be flattened by the insulating adhesive material to improve the surface smoothness. Further, it becomes possible to form fine wiring improved in circuit forming properties of outer layer circuits. Thus, miniaturization of multilayer printed circuit boards and lowering in generation of defectiveness can be attained.

Further, even if the cost for film may increase, the indexing for composing the press is not necessary, and thus the increase of production cost can be reduced to a remarkably low level. In addition, even if the steps for laminating the carrier and peeling of the carrier may be added, these steps can be automated, resulting in giving almost no influence on the processing time.

What is claimed is:

1. A process for producing a multilayer printed circuit board, which comprises the steps of:
   a) drilling holes on positions of a film material selected from the group consisting of a film material obtained from a single sided copper-clad laminate having an insulating adhesive layer with a semi-cured state on an insulating surface and a film material obtained by forming an insulating adhesive layer with a semi-cured state on one side of a copper foil,
   b) laminating the hole-drilled film material on an innerlayer circuit substrate so as to contact the insulating adhesive layer with the innerlayer circuit substrate and pressing with heating to give an integral laminate,
   c) roughening surfaces of the insulating adhesive layer flowed into the holes at the time of lamination under pressure and heating,
   d) conducting electrical connection between a circuit on the inner layer circuit substrate and the copper cladding or foil of the film material by plating inner walls of the holes or by filling the holes with an electroconductive paste, and
   e) forming a circuit by processing the copper of the film material.

2. A process according to claim 1, wherein the roughening step is conducted by using an aqueous solution containing at least one of a permanganate salt, and a chromic acid.

3. A process according to claim 1, wherein the insulating adhesive layer used in the step a) contains at least one inorganic filler, and the roughening step c) is conducted by using a treating solution containing an acid or an alkali.

4. A process according to claim 3, wherein the inorganic filler is selected from the group consisting of glass powder, calcium carbonate, magnesium calcium carbonate, and calcium silicate, and the treating solution contains hydrogen fluoride, hydrochloric acid, sulfuric acid or sodium hydroxide.

5. A process according to claim 1, wherein in the step a), a hole for evaluating a flowing amount of adhesive and having a diameter of A is formed previously, and during the step c) and step d), a diameter C for innerlayer circuit free from the adhesive flowed into the hole is measured, and considering the minimum hole diameter D necessary for electrical connection, the hole diameter to be formed in the film material is determined from D+(A−C).

6. A process for producing a multilayer printed circuit board, which comprises the steps of:
   a) drilling holes on positions of a film material made from an ultra-thin copper foil formed on a carrier and having an insulating adhesive layer with a semi-cured state on the copper foil,
   b) laminating the hole-drilled film material on an innerlayer circuit substrate so as to contact the insulating adhesive layer with the innerlayer circuit substrate and pressing with heating to give an integral laminate,
   c) removing the carrier from the laminate,
   d) conducting electrical connection between a circuit on the inner layer circuit substrate and the copper foil of the film material via the holes formed in the film material after removal of the carrier, and
   e) forming a circuit by processing the copper foil of the film material.

7. A process according to claim 6, wherein the thickness of ultra-thin copper foil is less than 12 μm.

8. A process according to claim 6, wherein the carrier is a copper foil, an aluminum foil or a resin film.

9. A process according to claim 6, wherein the carrier is removed by peeling.

10. A process according to claim 6, wherein the carrier is removed by using a chemical etching solution.

11. A process according to claim 6, wherein in the step b), a cushion material is further laminated on the film material and the innerlayer circuit substrate.

12. A process according to claim 11, wherein the cushion material is a sheet of paper, a rubber sheet, a silicon rubber sheet, a polypropylene film, a polyethylene film, a polyvinylidene chloride film, or a fluorine-containing material film.

13. A process according to claim 11, wherein the adhesive layer bonded to the film material has a flowing amount of 0.2 to 5.0%.

* * * * *